United States Patent [19]

Yamada

[11] Patent Number: 4,660,217
[45] Date of Patent: Apr. 21, 1987

[54] SHIFT REGISTER

[75] Inventor: Tatsuo Yamada, Itami, Japan

[73] Assignee: Mitsubishi Denki Kabushiki Kaisha, Tokyo, Japan

[21] Appl. No.: 814,242

[22] Filed: Dec. 27, 1985

[30] Foreign Application Priority Data

Dec. 27, 1984 [JP] Japan .................................. 59-276294

[51] Int. Cl.⁴ ............................................. G11C 19/00
[52] U.S. Cl. ........................................ 377/66; 377/69; 365/78
[58] Field of Search ..................... 377/66, 69, 67, 77; 365/78

[56] References Cited

U.S. PATENT DOCUMENTS 3,953,838  4/1976  Gilberg et al. ......................... 377/66
4,058,773  11/1977 Clark et al. ........................... 377/66
4,156,288  5/1979  Spandorfer ........................... 365/78

OTHER PUBLICATIONS

"Introduction to VLSI Systems" by Carver Mead and Lynn Conway, Addison Wesley Publishing Company, second printing, Oct. 1980.

Primary Examiner—John S. Heyman
Attorney, Agent, or Firm—Birch, Stewart, Kolasch and Birch

[57] ABSTRACT

A shift register which, including a plurality of cells each comprising a data latch section and a shift control section, operates without external clocks, wherein the shift control section includes a terminal for receiving a shift start control signal; a terminal for receiving a shift inhibition control signal; a shift allowance control circuit which receives signals indicating as to whether each of the particular cell and the cells adjacent thereto is in a shift operation and signals indicating as to whether each of the adjacent cells is in a state which allows the shift of the particular cell, and generates a shift allowance signal to be given to the particular cell and the adjacent cells on the basis of the states of these cells and the shift inhibition control signal; a shift control circuit which receives the shift start control signal, the output of the shift allowance control circuit, the state signals of the particular cell and the adjacent cell, and makes the data latch section to conduct a shift operation as well as outputs an in-shift-operation signal of the particular cell against the shift control circuit of the adjacent cell; and a shift conclusion control circuit which receives the shift inhibition control signal and the state signals of the particular cell and the adjacent cell, and outputs a signal for ordering to conclude the shift operation to the shift control circuit of the particular cell and a signal indicating the conclusion of shift operation to that of the adjacent cell.

3 Claims, 8 Drawing Figures

shift direction

FIG. 8.(PRIOR ART)

SHIFT REGISTER

FIELD OF THE INVENTION

The present invention relates to a shift register which shifts a data block of a desired bit length by a desired number of bits at a high speed, and which is capable of holding data at a portion of the data section which is not shifted.

BACKGROUND OF THE INVENTION

Figure 5:
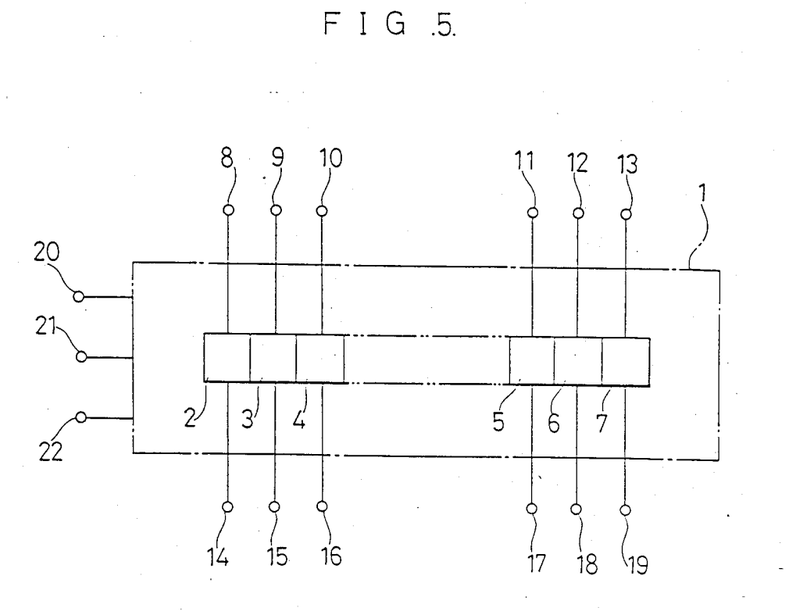
FIG. 5 is a diagram showing the construction of a prior art shift register.

In order to explain the background of the invention in detail, reference will be particularly made to FIG. 5 which shows a construction of a prior art parallel-input, parallel-output shift register:

In FIG. 5, the reference numeral 1 designates a shift register of bit length l including a first, second, third, . . . , (l−2)th, (l−1)th, and l-th cells (2, 3, 4, 5, 6, and 7). The first cell 2 is provided with a data input terminal 8 and a data output terminal 14. The second to l-th cell 3 to 7 are provided with data input terminals 9 to 13 and data output terminals 15 to 19, respectively.

A data input control terminal 20 is provided for controlling the data input from the data input terminals 8 to 13 to cells 2 to 7 of the shift register 1, in addition to a shift control terminal 21 for controlling the shift of data stored in cells 2 to 7, and a data output control terminal 22 for reading out the data stored in cells 2 to 7 of the shift register 1.

Figure 6:
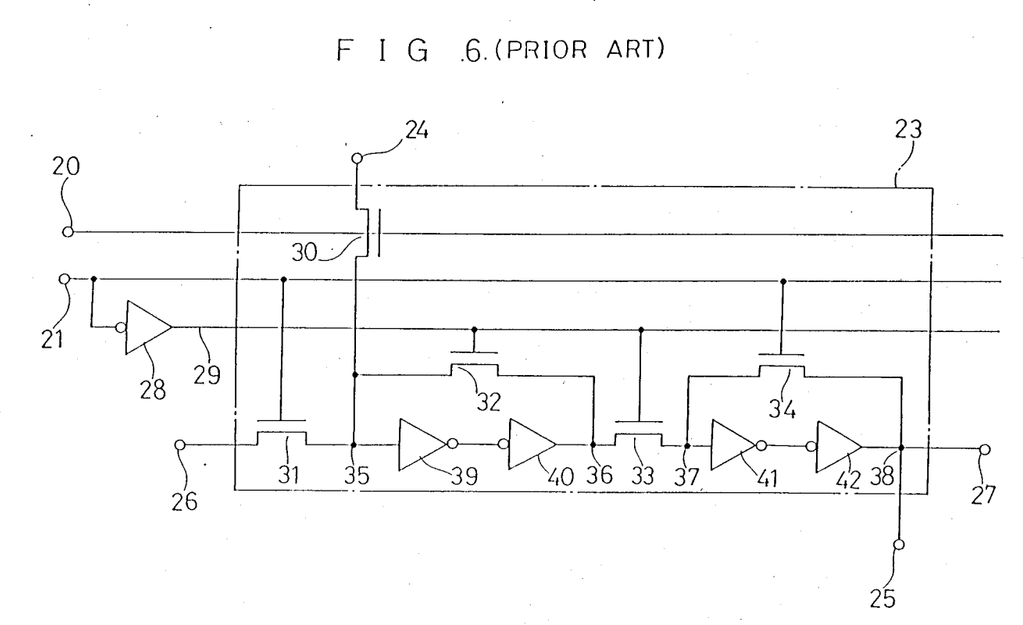
FIG. 6 is a diagram showing a construction of a cell of the shift register of FIG. 5.

FIG. 6 shows an example of a construction of cells 2 to 7 of the shift register 1 where symbols for N channel MOSFETs and logic circuits are used for illustration. This shows an example of a cell of the shift register conducting a shift in only one direction.

The reference numeral 23 designates a cell constituting a shift register 1. The number 24 designates a data input terminal of the cell 23 corresponding to the terminals 8 to 13 of FIG. 5, and the numeral 25 designates a data output terminal of the cell 23 corresponding to the terminals 14 to 19 of FIG. 5. The cell 23 is provided with a shift data input terminal 26 and a shift data output terminal 27. The data from the shift data output terminal of the cell at the former stage is input to the shift data input terminal 26 of the particular cell, and the data from the shift data output terminal 27 of the particular cell is input to the shift data input terminal of the cell at the next stage. When the cell 23 is used as the first cell 2, an arbitrary data is input to the shift data input terminal 26. When it is used as the l-th cell 7, the shift data output terminal 27 is made open. There is provided an inverter 28 which receives a signal input to the shift control terminal 21 and outputs a latched signal 29.

There are provided transfer gates 30 to 34 each constituted by N channel enhancement type MOS FETs. One end of each of the transfer gates 30 to 32 are connected to the node 35, and one end of both of the transfer gates 33 and 34 are connected to the node 37. The one ends of the transfer gate 30 and 31 are connected to the data input terminal 24 and the shift data input terminal 26, respectively. The other ends of the transfer gates 32 and 33 are connected to the node 36, and the other end of the transfer gate 34 is connected to the node 38.

The signal of the node 38 is output of the data output terminal 25 and the shift data output terminal 27. The signal input to the data input control terminal 20 is input to the gate of the transfer gate 30, and the signal input to the shift control terminal 21 is input to the gates of the transfer gates 31 and 34, and the latched signal 29 is input to the gates of the transfer gates 32 and 33.

There are provided two inverters 39 and 40 connected in series to each other. The inverter 39 receives the signal at the node 35, and the output thereof is connected to the input of the inverter 40. The output of the inverter 40 is connected to the node 36. There are also provided two inverters 41 and 42 connected in series to each other. The inverter 41 receives the signal of the node 37, and the output thereof is connected to the input of the inverter 42. The output of the inverter 42 is connected to the node 38.

In this way, the cell 23 of a 2-input latch type shift register is constituted by transfer gates 30 to 34 and inverters 39 to 42. The the data input control signal input to the terminal 20, the shift control signal input to the terminal 21, and the latched signal 29 are commonly used through all of the cells.

This shift register is operated as follows:

In the following description positive logic is used, and the positive logic state is represented by "1", while the non-positive logic state is represented by "0".

In FIG. 6, if a signal input to the shift control terminal 21 is kept "0", the cell 23 becomes a latching state, and the shift register 1 does not conduct a shift operation. Then if the signal input to the data input control terminal 20 is made "1" and data is input from the data input terminal 24 with a driving force enough to change the latching state, the input data is latched at the cell 23. Thereafter, if the signal input to the data input control terminal 20 is made "0" and "1" is input to the shift control terminal 21, the data is shifted by one bit.

Figure 7:
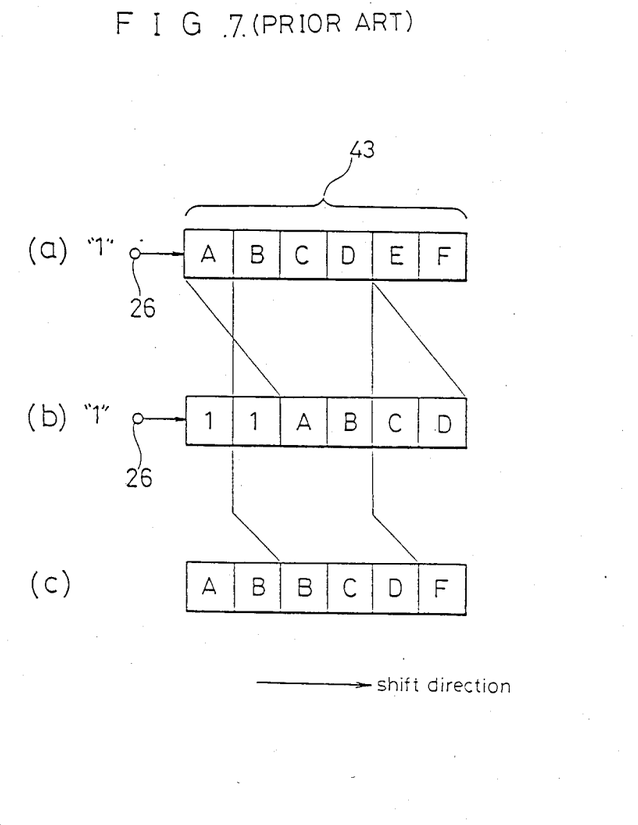
FIG. 7 is a diagram showing the state of the shifted data in the prior art shift register.

FIG. 7 diagrammatically shows the operation of the shift register of FIG. 6, especially showing the movement of the shifted data clearly. FIG. 7(a) shows a 6-bit shift register 43 including a first to a sixth cell arranged from the left to the right. FIG. 7(a) shows a state where the data A, B, . . . , F are set into the 6-bit shift register 43 from the left to the right. When signal "1" is input to the shift data input terminal 26 of the first cell and 2 bits are shifted to the right side, it results in the state shown in FIG. 7(b).

In order to conduct a 2-bit shift as described above it is necessary to input "1" two times to the shift control terminal 21. Similary, it is generally necessary to input a shift control signal n times in order to conduct an n-bit shift, and then it is furthermore necessary to control the shift number.

Furthermore, it is necessary to input a shift control signal to each cell in order to move only three bits of B to D among A to F to the right by one bit with no changes in the states of A to F because the content of all the cells usually changes by the shift operation. In any case, it is only possible to conduct a 1-bit shift in a shift, resulting in difficulty in a high speed operation especially in a shift register of large bit number.

Figure 8:
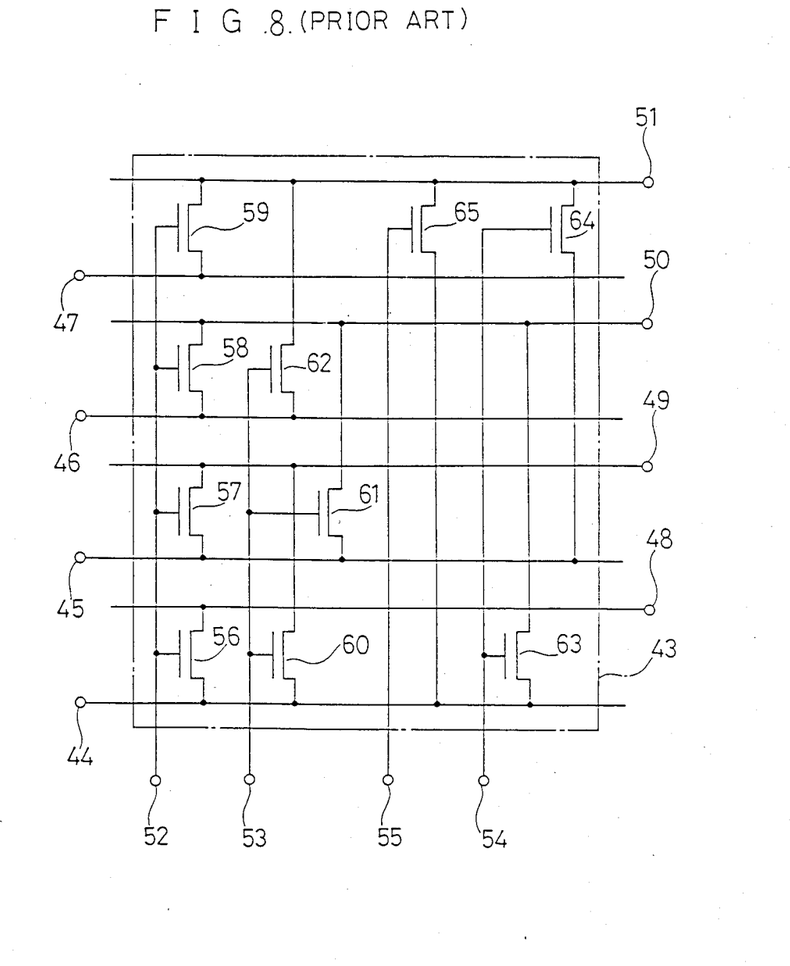
FIG. 8 is a diagram showing an example of a barrel shifter as an example of a construction of a prior art shift register.

FIG. 8 shows a so-called barrel shifter which has an improvement over the above-described problem where it is required that n pieces of shift control signals be used in an n bit shift. In this barrel shifter all the bits can be transmitted at one time.

FIG. 8 shows an example of construction of a 4-bit barrel shifter constituted by N channel enhancement type MOS FETs. This barrel shifter involves only one direction shift, and no rotation function. The circuit section for latching input data and the control section related to the shift control signal are not shown.

There are provided a first to fourth data input terminals 44 to 47, and a first to fourth data output terminals 48 to 51. There are further provided 0th bit, 1st bit, 2nd bit, and 3rd bit shift control terminals 52 to 55, and transfer gates 56 to 65.

The transfer gate 56 is connected between the first data input terminal 44 and the first data output terminal 48. Similarly as above, the transfer gate 57, 58, 59, 60, 61, 62, 63, 64, and 65 are connected between the terminals 45 and 49, between 46 and 50, 47 and 51, 44, and 49, 45 and 50, 46 and 51, 44 and 50, 45 and 51, and 44 and 51, respectively.

The 0th bit shift control terminal 52 is connected to the gates of the transfer gates 56 to 59, and the 1st bit, 2nd bit, 3rd bit shift control terminal 53, 54, and 55 are connected to the gates of the transfer gates 60 to 62, 63 and 64, and 65, respectively.

This barrel shifter shown in FIG. 8, is operated as follows:

The data of 4 bits to be shifted is input to the data input terminals 44 to 47. Then, "0" is input to each of the bit shift control terminals 52 to 55. Thereafter, when, for example, a 2-bit shift is conducted, the 2-bit shift control terminal 54 is made "1". Thus, the data input to the first data input terminal 44 is output to the third data output terminal 50 through the transfer gate 63. The data input to the second data input terminal 45 is output to the fourth data output terminal 51 through the transfer gate 64. Then the states of the first data output terminal 48 and the second data output terminal 49 are not determined.

As described above, in the barrel shifter shown in FIG. 8, it is possible to conduct an n-bit shift by inputting a shift control signal only one time. However, as the bit number of the barrel shifter increases the number of transfer gates as well as that of bit shift control lines increases, resulting in difficulty in miniaturization. Furthermore, the data input line, the data output line, the bit shift control line, and the transfer gate cross with each other, similarly resulting in difficulty in miniaturization. Furthermore, in order to conduct a shift as shown in FIG. 7(c) an increase in the number of transfer gates and an addition of bit line control lines are required resulting in a large sized device.

Another prior art barrel register is disclosed in an article "Introduction to VLSI Systems" by CARVER MEAD, LYNN CONWAY, ADDISON WESLEY PUBLISHING COMPANY, Second Printing, October, 1980. In this article FIG. 5, 14 shows an example of a 4-input, 4-output barrel shifter, wherein there is provided a cross-bar switch for connecting each of the inputs to each of the outputs.

SUMMARY OF THE INVENTION

The present invention is directed to solve the problems pointed out above, and has for its object to provide a shift register capable of shifting a desired number of bits among a data block of desired length by a simplified construction, and further capable of holding data at a portion which is not shifted.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, there is provided a shift register which, including a plurality of cells each comprising a data latch section and a shift control section, operates without external clocks, wherein the shift control section comprises: a terminal for receiving a shift start control signal; a terminal for receiving a shift inhibition control signal; a shift allowance control circuit which receives signals indicating as to whether each of the particular cell and the cells adjacent thereto is in a shift operation and signals indicating as to whether each of the adjacent cells is in a state which allows the shift of the particular cell, and generates a shift allowance signal to be given to the particular cell and the adjacent cells on the basis of the states of these cells and the shift inhibition control signal; a shift control circuit which receives the shift start control signal, the output of the shift allowance control circuit, the state signals of the particular cell and the adjacent cell, and makes the data latch section to conduct a shift operation as well as and outputs an in-shift-operation signal of the particular cell against the shift control circuit of the adjacent cells; and a shift conclusion control circuit which receives the shift inhibition control signal and the state signals of the particular cell and the adjacent cell, and outputs a signal for ordering to conclude the shift operation to the shift control circuit of the particular cell and a signal indicating the conclsion of shift operation to that of the adjacent cell.

DETAILED DESCRIPTION OF THE PREFERRED EMBODIMENTS

Figure 1:
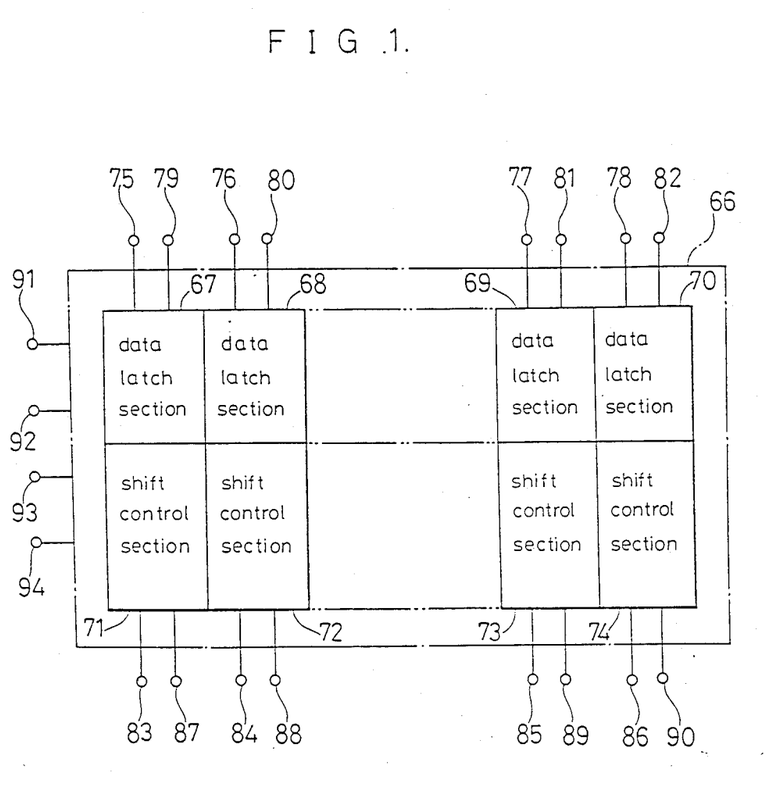
FIG. 1 is a diagram showing a construction of a shift register as an embodiment of the present invention.

In order to explain one embodiment of the present invention, reference will be particularly made to FIG. 1:

The referenc enumeral 66 designates a shift register of length l which includes a first, second, . . . , (l−1)th, and l-th data latch (67, 68, 69 and 70), and a first, second, . . . , (l−1)th, and l-th shift control section (71, 72, 73, and 74). The data latches 67, 68, 69, and 70 are provided with data input terminals 75, 76, 77, and 78, and data output terminals 79, 80, 81, and 82, respectively. The shift control sections 71, 72, 73, and 74 are provided with shift start control terminals 83, 84, 85, and 86, and shift inhibition control terminals 87, 88, 89, and 90, respectively. There is provided a data input control terminal 91 for controlling the input of data into the shift register 66, and a data output control terminal for controlling the output of data from the shift register 66. There is also provided a reset terminal 92 for placing the shift register 66 in an intial state, and a direction control terminal 94 for determining the data shift direction.

Operation of the shift register shown in FIG. 1 is described.

At first, the shift register 66 becomes an initial state when a reset signal is input to the reset terminal 93. Thereafter, a control signal is input to the data input control terminal 91, whereby data are latched at the data latches 67 to 70 from the data input terminals 75 to 78.

When the data block of (m−n+1) bit from m-th to n-th of the n bit length shift register 66 is to be shifted until p-th bit, the shift direction is determined by the direction control terminal 94, and the shift inhibition control terminals of m-th and p-th bits are made effective. Thereafter, the shift start control terminals of the bits which is adjacent to the n-th bit in the shift direction are made effective. Thus, a shift is started in a special shift speed determined by the data shift and latching speed of the data latch section and the speed of the shift control section. Hereupon, there is a relation that $1 \leq m \leq n < p \leq l$, or $1 \leq p < n \leq m \leq l$.

An example of the former case where the data from the 3rd to 7th bit are shifted to the 13th bit in the 16 bit shift register will be described in the following.

In this case, the shift inhibition control terminals of the 3rd and 13th bit are made effective, and the shift start control terminal of the 8th bit is made effective. Then, a shift is started, whereby the data from 3rd to 7th bit are shifted from 9th to 13th bit, and the contents of 1st and 2nd, and 14th to 16th bit do not change. Furthermore, if the shift inhibition control terminal of m-th bit, that is, the 3rd bit is not made effective, the data of 1st and 2nd bit are also shifted.

In a case where m is equal to 1, or p is equal to l, a signal indicating that the bit corresponding to the 0-th bit is not always in a shift operation is input to the 1st bit, and a signal indicating that the bit corresponding to (p+1)th bit is not always in a shift operation is input to p-th bit.

A shift operation will be described in detail.

A shift operation is started with a shift of n-th bit to (n+1)th bit. When the shift start control terminal of (n+1)th bit is made effective for a required period, the (n+1)th shift control section outputs a signal inhibiting shift operation to n-th and (n+2)th shift control section, and the data is shifted from the n-th data latch to (n+1)th data latch.

When the (n+1)th shift control section detects the conclusion of shift operation, it cancels the signal inhibiting shift operation which has been output to the both adjacent bits, and outputs signals ordering to conclude shift operation to the both adjacent bits. The n-th and (n+2)th shift control sections which receive the latter signal recognize that one of the requirements for entering a shift operation is satisfied at first after the reset, and the n-th shift control section recognizes that (n−1)th and (n+1)th bits are not in shift operation, and then a shift operation is started from (n−1)th bit. Similarly, the (n+2)th shift control section recognizes that (n+1)th and (n+3)th bits are not in shift operation, and then a shift operation is started from (n+1)th bit.

The shift operation follows similarly as above, and when the data of n-th bit reaches p-th bit, the shift control section of p-th bit inhibits a shift of p-th bit itself, and also inhibits a shift operation of (p+1)th bit when the shift operation of itself is concluded. Furthermore, it also inhibits a subsequent shift of (p−1)th bit when the shift of (p−1)th bit is concluded, and outputs a signal enabling to send a similar signal to (p−2)th bit. The shift operation does not proceed any more similarly as above.

Furthermore, if it is assumed that the shift of m-th bit is a first shift, (m−1)th bit enters a shift operation in a usual case. However, because the shift inhibition control terminal of m-th bit is effective, an information that the m-th bit is shifted at first after the reset is not transmitted to the (m−1)th bit. Accordingly, the (m−1)th bit does not enter a shift operation, and the data of a portion which is not shifted is held.

Figure 2:
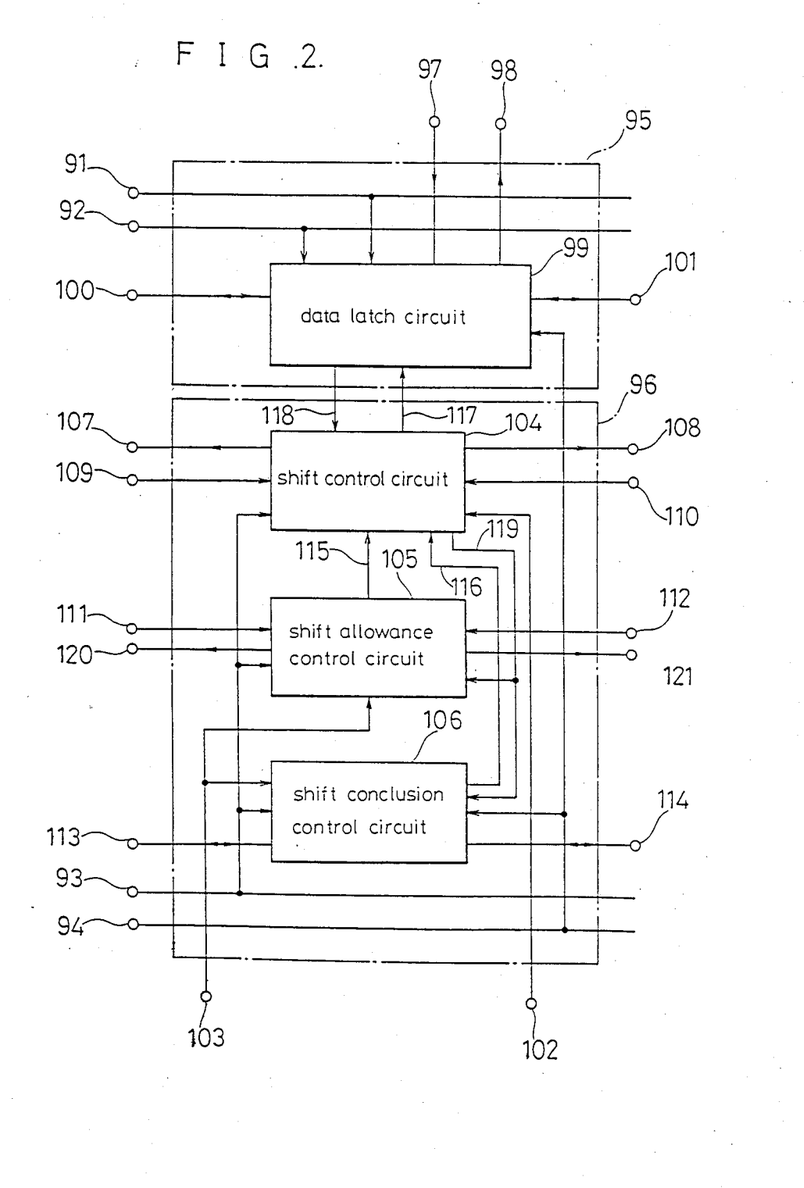
FIG. 2 is a diagram showing a detailed construction of the embodiment illustrated in FIG. 1.

FIG. 2 shows a construction of the data latch and the shift control section of FIG. 1. In FIG. 2, the reference numeral 95 designates a data latch section, the numeral 96 designates a shift control section, the numeral 97 designates a data input terminal, and the numeral 98 designates a data output terminal, and the numeral 99 designates a data latch circuit. Herein, the bit adjacent to the particular bit at the left side in FIG. 2 is defined as former stage, and the bit adjacent to the particular bit at the right side in FIG. 2 is defined as next stage. As for shift direction, there are two cases there shift is conducted from the former stage, and where shift is conducted from the next stage. The arrows on lines in FIG. 2 show a direction along which signal flows, wherein the two arrows on a line mean that signal can flow in both of two directions.

Furthermore, the numeral 100 designates a data shift terminal through which data is shifted between the former stage data latch and itself. The numeral 101 designates a data shift terminal through which data is shifted between the next stage data latch and itself. The numeral 102 designates a shift start control terminal. The numeral 103 designates a shift inhibition control terminal. The numeral 104 designates a shift control ciucuit which conducts a shift control of the data latch circuit 99. The numeral 105 designates a shift allowance control circuit which allows a start of a first shift operation. The numeral 106 designates a shift conclusion control circuit ordering to conclude a shift operation.

The reference numerals 107 and 108 designate terminals for outputting an in-shift-operation signal to the former and the next stage shift control section which signal means the data latch section 95 and the shift control section 96 of the particular cell are in shift operation. The numeral 109 designates a terminal for receiving a former stage in-shift-operation signal indicating the prior stage is in shift operation. The numeral 110 designates a terminal for receiving a next stage in-shift-operation signal indicating that the next stage is in shift operation. The numerals 111 and 112 designate terminals for receiving shift allowance signals from the former and the next stage. The numeral 113 designates a shift conclusion terminal for receiving a shift conclusion signal from the former stage or for outputting a shift conclusion signal to the former stage. The numeral 114 designates a shift conclusion terminal for receiving a shift conclusion signal from the next stage or for outputting a shift conclusion signal to the next stage.

The reference numeral 115 designates a shift allowance signal output from the shift allowance control circuit 105 for indicating to allow a shift operation to the shift control circuit 104. The numeral 116 designates a shift conclusion signal output from the shift conclusion control circuit 106 for ordering a conclusion of the shift operation of the shift control circuit 104. The numeral 117 designates a data latch output from the shift control circuit 104 for making the data latch circuit 99 latch the data. The numeral 118 designates a judgment condition input used in a judgment in the shift control circuit 104 as to whether a shift operation is concluded in the data latch circuit 99. The numeral 119 designates a shift operation conclusion output from the shift control circuit 104 to be input to the shift allowance control circuit 105 and the shift conclusion control circuit 106 for indicating that a shift operation in the data latch circuit 99 is concluded. The numeral 120 designates a terminal for a signal output from the shift allowance control circuit 105 to the former stage, which signal indicates permission to continue a shift operation. The numeral 121 designates a terminal for a signal output from the same to the next stage, which signal indicates permission to continue a shift operation.

The signals from the data input control terminal 91 and the data output control terminal 92 are connected to the data latch circuit 99, and the signal from the reset terminal 93 is connected to the shift control circuit 104, the shift allowance control circuit 105, and the shift conclusion control circuit 106. The signal from the direction control terminal 94 is connected to the data latch circuit 99 and the shift conclusion control circuit 106.

The data shift terminals 100 and 101 are connected to the data shift terminals of the former and next stage, respectively, and when the data shift terminal 100 or 101 is located at a bit at the end of the shift resister 66, the data shift terminal 100 or 101 as a data input terminal is used a as terminal for receiving an arbitrary value as an input or it is used in an open state, and the data shift terminal 100 or 101 as a data output terminal is used in an open state or as a terminal for outputting a signal to be input to other circuits (not shown). In-shift-operation signal terminals 107 and 108 of the particular cell are connected to the next stage in-shift-operation signal of the former stage and the former stage in-shift-operation signal of the next stage, respectively, and one of the terminals 107 and 108 is made an open state if the particular cell is located at the end of the shift resister 66. The former stage in-shift-operation signal terminal 109 of the particular cell is connected to the in-shift-operation signal terminal of the former stage, and the next stage in-shift-operation signal terminal 110 of the particular cell is connected to the in-shift-operation signal terminal of the next stage, and one of the terminals 109 and 110 is made ineffective if the particular cell is located at the end of the shift resister 66. The shift continuation allowance signals of the former and the next stage are connected to the shift allowance signal terminals 111 and 112 of the particular cell, respectively, and a signal not contrary to shift allowance is input thereto if the particular cell is located at the end of the shift register 66. The directions of signals at the shift conclusion terminals 113 and 114 are determined in accordance with a signal at the direction control terminal 94, and if one is an input, then the other is an output. The shift conclusion terminals of the former stage and the next stage are connected to the shift conclusion terminals 113 and 114, respectively, and when the shift conclusion terminal 113 or 114 is located at the end of the shift resister 66, it is used in an open state or an input signal to an arbitrary circuit (not shown) if it is a shift conclusion terminal as an output, and it is made an effective state or a state which does not hurt the operation of the shift conclusion control circuit if it is a shift conclusion terminal as an input.

The operation of the shift register 66 will be described in detail with reference to FIG. 2.

It is presumed that the data shift direction is one such that data is shifted from the former stage to the next stage under the control of the signal at the direction control terminal 94. It is assumed that the bit shown in FIG. 2 corresponds to the Q-th bit of the shift resister 66 for simplification. The Q is set as $1 \leq Q \leq l$, without being a specific value, but is set to be $m \leq Q \leq n$, or $Q = n+1$ for simplification. It is also assumed that the Q is set at an arbitrary number which satisfies $1 \leq Q \leq l$ until the value of Q is changed.

At first, the shift control circuit 104 is initialized at a state not in-shift-operation, the shift allowance control circuit 105 is initialized at a state which inhibits shift operation of the shift control circuit 104, and the shift conclusion control circuit 106 is initialized at a state where a shift operation is not concluded, respectively, by a reset signal input to the reset terminal 93. Therefore, the in-shift-operation signal terminals 107 and 108 are initialized at "0", the data latch output 117 is initialized at "0", the shift allowance output 115 at "0", the shift continuation allowance terminal 120 at "1", the shift conclusion terminal 113 at "0", and the shift conclusion output 116 at "0", respectively.

Next, data is input from the data input terminal 97 to the data latch circuit 99 and held thereat by a signal input to the data input control terminal 91. To the contrary, when data is to be read out from the data latch circuit 99, data is read out from the data output terminal 98 by a signal input to the data output control terminal 92. Herein, the data input control terminal 91 and the data output control terminal 92 may be included in an external circuit not shown, or may not exist. Furthermore, the data input terminal 97 and the data output terminal 98 may be the same one, or may not exist.

Besides, the shift allowance control circuit 105 is provided so as to prevent the shift operation from being started arbitrarily after the reset signal is cancelled. It functions so as to not conduct a shift operation until at least one of the adjacent bits concludes a shift operation first. It also functions to operate the shift operation proper order.

Thereafter, it functions to make the shift inhibition control terminals of m-th and p-th bit effective, and keeps them effective at least inside the shift conclusion control circuit 106 until the shift of the bit is concluded.

The Q is set to be equal to n+1 in the following explanation.

The shift start control terminal 102 of (n+1)th bit is made effective, and a shift operation is started at the shift control circuit 104. In the start of the shift operation triggered by this signal, the states of the former stage in-shift-operation signal terminal 109, the next stage in-shift-operation signal terminal 110, and the shift allowance output 115 from the shift allowance control circuit 105 are ignored. By the start of shift operation the in-shift-operation signal terminals 107 and 108 are made "1", and the shift operations of n-th and (n+2)th bit are inhibited so as to shift a stable data from n-th bit to (n+1)th bit, and not to shift the shifted data. The data latch output 117 is made "1", and a shift operation of the data latch circuit 99 is conducted, whereby the shift operation conclusion output 119 is made "0".

The conclusion of the shift operation is detected in accordance with the judgement condition input 118 by the shift control circuit 104. When the conclusion of shift is detected, the data latch output 117 is made "0"

so as to hold the data shifted. The in-shift-operation signal terminals 107 and 108 are made "0" so as to indicate that the particular bit is not in shift operation to the adjacent n-th and (n+2)th bits. Furthermore, it is not conducted the judgment of conclusion of shift operation in the shift control circuit 104, whereby the shift operation conclusion output 119 is made "1". Thus the shift of the particular bit is concluded despite the fact that the shift allowance signal terminals 111 and 112 are "0", and therefore, the shift allowance control circuit 105 makes the shift continuation allowance terminals 120 and 121 "1" so as to allow the subsequent shift operation of the former or next stage when the shift of the former or next stage is allowed by a signal at the shift inhibition control terminal 103.

Furthermore, the shift conclusion control circuit 106 conducts a judgment as to whether the (n+1)th bit is p-th bit or not in accordance with a signal at the shift inhibition control terminal 103, and makes the shift conclusion terminal 113 "1" when n+1=p, thereby enabling the former stage to conclude a shift operation when the former stage of the former stage concluded a shift to the former stage, and makes the shift conclusion output 116 of the particular bit "1" so as to make the shift control circuit 104 not to conduct a subsequent shift operation. Furthermore, in this case where the signal at the shift inhibition control terminal 103 is effective and the shift of the next stage is not allowed, the shift allowance control circuit 105 does not make the shift continuation allowance terminal 121 "1", and inhibits a shift of the next stage. Thus, the next stage does not conduct a shift, and accordingly the next of next stage and those subsequent thereto, do not conduct a shift. If n+1≠p, the shift conclusion terminal 113 and the shift conclusion output 116 are kept "0", and accordingly, they allow a subsequent shift operation of the (n+2)th bit. The n-th bit enters an operation to shift data from the (n−1)th bit triggered by the conclusion of data shift of (n+1)th bit. Similarly, if n+1≠p, (n+2)th bit enters an operation to shift data from the (n+1)th bit.

Next, Q is set to n and a shift operation of the n-th bit is described.

The next stage corresponds to (n+1)th bit and the former stage corresponds to (n−1)th bit. the signal from the shift continuation allowance terminal of the next stage (n+1)th bit is input to the shift allowance signal terminal 112, and the shift allowance control circuit 105 makes the shift allowance output 115 "1" so as to allow the shift control circuit 104 to conduct a shift triggered by the conclusion of shift operation of the (n+1)th bit. The shift control circuit 104 starts a shift operation of the n-th bit from (n−1)th bit on a condition that the former stage in-shift-operation signal 109 and the next stage in-shift-operation signal 110 are "0" and the shift conclusion output 116 is "0". The shift operation is the same as that of (n+1)th bit described above.

When the shift operation conclusion output 119 indicating that the shift of n-th bit is concluded becomes "1", the shift allowance control circuit 105 does not make the shift continuation allowance terminal 120 "1" when the shift inhibition control terminal 103 is effective. Accordingly, a subsequent shift operation from the former stage to 1st bit is not conducted thereby keeping the data. If a signal at the shift inhibition control terminal 103 does not inhibit a shift, a shift operation of the other bit is conducted similarly as above. In a case where n+1 is equal to p, a shift operation of the n-th bit is not conducted thereafter by the shift conclusion control circuit 106 as described above.

The Q is again set to n+2, and a shift of data from (n+1)th bit to (n+2)th bit will be described.

The former stage corresponds to (n+1)th bit and the next stage corresponds to (n+3)th bit. The shift continuation allowance terminal of the former stage is connected to the shift allowance signal terminal 111, and when the former stage (n+1)th bit concludes a shift and the shift continuation allowance terminal becomes "1", the shift allowance control circuit 105 sends a shift allowance output 115 of "1" to the shift control circuit 104. The shift control circuit 104 makes a shift operation of (n+2)th bit start when the in shift operation signal of (n+1)th bit becomes "0", that is, on a condition that shift operation of (n+1)th bit is concluded, and furthermore on conditions that the in-shift-operation signal of the next stage is "0" and that the output of the shift conclusion control circuit 106 is not effective. The shift operation is the same as that of (n+1)th bit. In this way a shift operation is conducted continuously similarly as described above.

Besides, when (n+2) is equal to P, the shift conclusion control circuit 106 outputs "1" to the shift conclusion terminal 113 similar to the shift operation of (n+1)th bit, and a shift operation of (n+2)th bit subsequent thereto is not conducted. Furthermore, the shift continuation allowance terminal 121 is made "0", and a shift of (n+3)th bit and subsequent thereto are inhibited. When n+2 is not equal to p, a shift of (n+3)th bit is started subsequent thereto.

Figure 3:
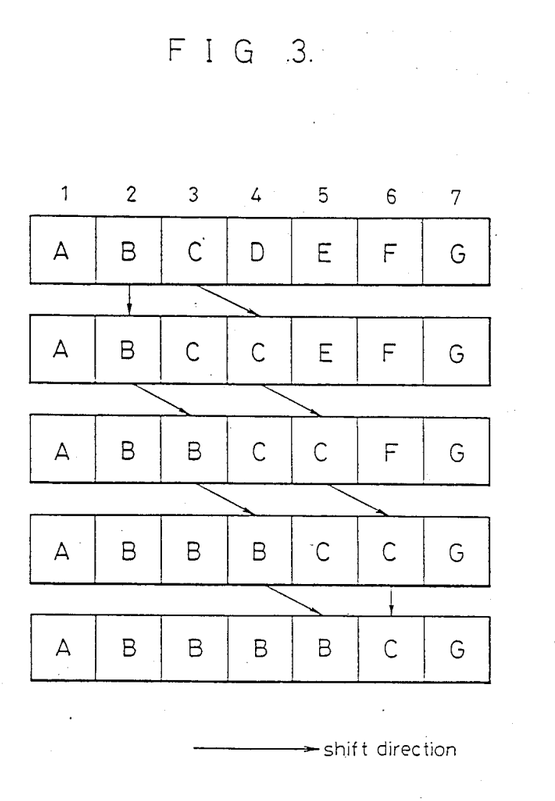
FIG. 3 is a diagram showing the state of the shifted data.

FIG. 3 schematically shows the shifting state of the actual data. In this Figure the state of each bit is shown the data A, B, C, D, E, F, and G are set to a 7-bit shift register in order, and the block of the 2nd and 3rd bits are shifted to the 5th and 6th bit. The upmost column of FIG. 3 shows a state where data is set to a shift resister. When a shift is started after required conditions are established, the content of the shift register transits to states shown in lower columns, and finally the 2nd and 3rd bits are shifted to 5th and 6th bits with no changes in the data of 1st and 7th bit A and G which are located at the portion not to be shifted.

In this embodiment, the data of an arbitrary length at an arbitrary position is shifted to an arbitrary position at a high speed, and data at a portion not to be shifted is held.

Figure 4:
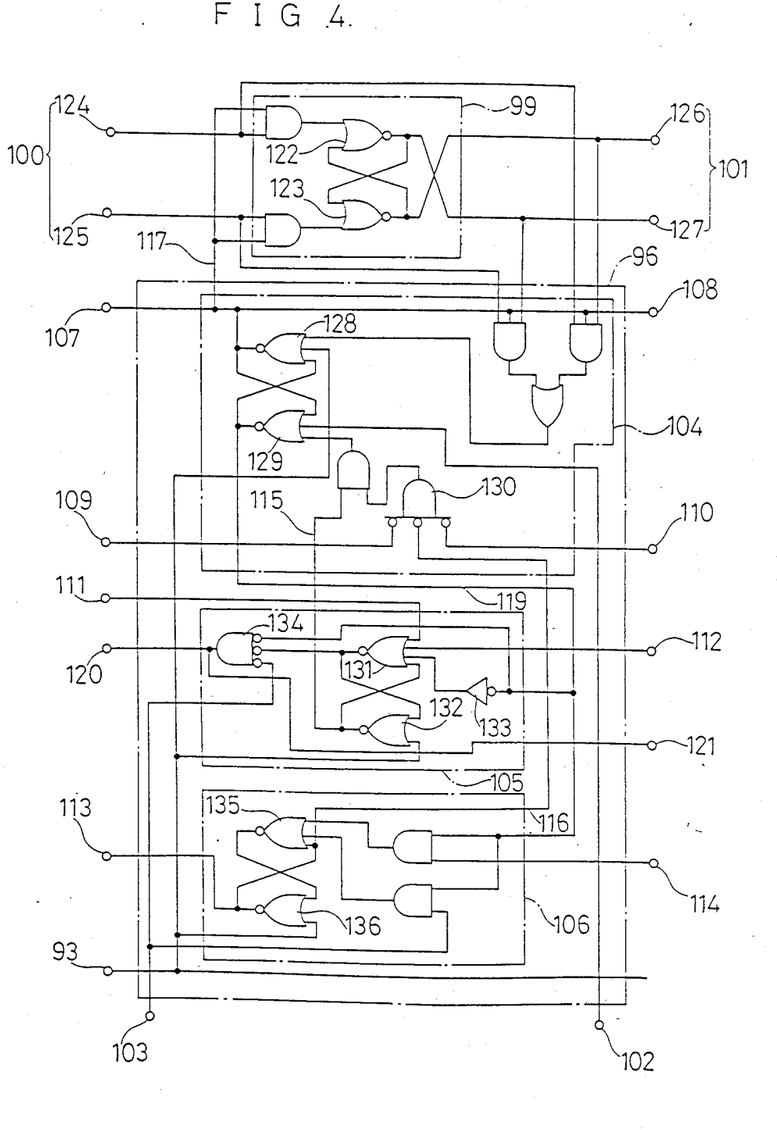
FIG. 4 is a diagram showing an example of a cell.

FIG. 4 shows an example of construction of each circuit. In FIG. 4, it is presumed that data is shifted in only one direction, that is, from the left to the right. The direction control terminal 94, the data latch circuit 99 which receives the signal from the terminal 94 as an input, and the circuit for controlling the direction in the shift conclusion control circuit 106 are not shown.

The data latch circuit 99 is constituted by an ANDNOR circuit 122 which has a 2-input AND circuit, and an ANDNOR circuit 123 which has similarly a 2-input AND circuit which together constitute a flip-flop. The reference numerals 124 and 125 designate data shift input terminals corresponding to the data shift terminal 100 shown in FIG. 2, and the numerals 126 and 127 designate data shift output terminals corresponding to the data shift terminal 101. The data shift output terminal 126 is connected to the output of the ANDNOR circuit 123, and the data shift output terminal 127 is connected to the output of the ANDNOR circuit 122. Mutually reverse phase signals are input to the data shift input terminals 124 and 125, and mutually reverse phase signals are output from the data shift output terminals 126 and 127. Stable signals at the data shift input terminals 124 and 125 are taken into the data latch circuit 99 by the data latch output 117, the signals of the data shift input and output terminals 124 and 126 come to have the same phase and the signals of the input and output terminals 125 and 127 also come to have the same phase. In this data latch circuit 99, it is apparent that it is easy to set data and to read out data, and therefore, the data input and data output control terminals 91 and 92, and the data input and data output terminals 97 and 98 are not shown.

The construction of the shift control circuit 104 is described below.

The reference numeral 128 designates an ANDNOR circuit which have 2 couples of 3-input AND circuits. The numeral 129 designates an ANDNOR circuit which have 2-input AND circuit constituting a flip-flop with the ANDNOR circuit 128. The numeral 130 designates a 3 input NOR circuit. The output of the AND-NOR circuit 128 which constitutes a flip-flop is connected to the in-shift-operation signal terminals 107, 108 and the data latch output 117, and the output of the ANDNOR circuit 129 becomes the shift operation conclusion output 119. The former stage in-shift-operation signal terminal 109, the next stage in shift operation signal terminal 110, and the shift conclusion output 116 are connected to the NOR circuit 130.

The output of the ANDNOR circuit 128 is made "0" by a reset signal input from the reset terminal 93, and the four signals at the data shift input terminals 124 and 125 and the data shift output terminals 126 and 127 corresponding to the judgement condition input 108, and furthermore, the output of the ANDNOR circuit 128 are all connected to the two 3-input AND circuits of the ANDNOR circuit 128. The data shift input terminal 124, the data shift output terminal 126, and the output of the ANDNOR circuit 128 are connected to the one of the 3-input AND circuit of the ANDNOR circuit 128, and the data shift input terminal 125, the data shift signal output terminal 127, and the output of the ANDNOR circuit 128 are connected to the other 3 input AND circuit. This circuit portion is intended to detect a conclusion of shift operation of the data latch circuit 99, that is, a coincidence between the input shift data and the output shift data. Accordingly, when the data latch output 117 is made effective, this circuit detects a coincidence immediately when the data shift output held by the data latch and the data shift input to be taken in becomes coincident with each other.

The NOR circuit 130 becomes effective when conditions are satisfied that the former stage and the next stage are not in shift operation and that the output of the shift conclusion control circuit 106 is not effective, that is, a shift is not concluded. The output of the NOR circuit 130 is furthermore multiplied by the output 115 of the shift allowance control circuit 105, and is input to the ANDNOR circuit 129. The shift allowance output 115 which is the output of the shift allowance control circuit 105 becomes effective when a shift of the former stage, the next stage, or the particular stage itself is started at first after a reset. The shift allowance control circuit 105 is made "0" by the reset signal. The output of the ANDNOR circuit 128 becomes "1" to thereby to start a shift operation when the "1" is input to the shift start control terminal 102, and a shift operation of the shift register 66 is at first started, or when the output of the NOR circuit 130 described above becomes "1" and the shift allowance output 115, that is, the output of the shift allowance control circuit 105, which is also described above, is made "1". To the contrary, the shift operation conclusion output 119 which is the output of the ANDNOR circuit 129 becomes "1", that is, becomes effective, when a reset signal is input from the reset terminal 93 or when the conclusion of the shift operation of the data latch circuit 99 described above is detected by the shift control circuit 104.

The shift allowance control circuit 105 comprises a flip-flop including a NOR circuit 131 having 4 inputs, and a NOR circuit 132 having 2 inputs, an inverter 133 which receives a shift operation conclusion output 119 as its input, and a NOR circuit 134 which has 3 inputs. The output of the NOR circuit 132 is the shift allowance output 115. The shift allowance signal terminals 111, 112, and the output of the inverter 133 are input to the NOR circuit 131, and the signal from the reset terminal 93 is input to the NOR circuit 132. The condition on which the shift allowance output 115 becomes "1" is the same as described above. The output of the NOR circuit 134 is connected to the shift continuation allowance terminals 120 and 121. The three inputs of the NOR circuit 134 are the shift operation conclusion output 119, the output of the NOR circuit 131, and the input signal from the shift inhibition control terminal 103. The output of the NOR circuit 134 becomes effective, and "1" is output at the shift continuation allowance terminals 120 and 121 when conditions that the shift allowance output 115 described above becomes "1" and that the shift operation conclusion output 119 becomes "0" are satisfied, and the signal from the shift inhibition control terminal 103 is established as ineffective. That is, the shift allowance control circuit 105 is intended to start a shift operation of the former or next stage when a shift operation of itself is started after the former or next stage have conducted a shift operation once at first, or when a shift is started by the shift start control terminal 102, that is, when it is $(n+1)$th bit, subsequent to the time when the input of the shift inhibition control terminal 103 is "0", and furthermore a shift operation does not occur disorderly after a reset. Furthermore, it is intended not to start a shift operation of the former or next stage when the input of the shift inhibition control terminal 103 is "1".

The shift conclusion control circuit 106 is constituted by a flip-flop including an ANDNOR circuit 135 having two 2-input AND circuits and the NOR circuit 136. The shift operation conclusion output 119 and the signal at the shift inhibition control terminal 103 are input to one of the AND circuit of the ANDNOR circuit 135, and the shift conclusion terminal 114 and the shift operation conclusion output 119 are connected to the other AND circuit. The output of the NOR circuit 136 is connected to the shift conclusion terminal 113, and it also becomes a shift conclusion output 116. the output of this NOR circuit 136 becomes "0" by a reset pulse at the reset input terminal 93. The function of the shift conclusion control circuit 106 is to make the shift conclusion output 116 "1" so as not to have a shift operation occur subsequent thereto when "1" is input to the shift inhibition control terminal 103, that is, when it confirms the conclusion of shift operation of itself by the shift operation conclusion output 119 when it is m-th or p-th bit. When it is m-th bit a signal is sent from the shift conclusion terminal 113 to $(m-1)$th bit, but it generates no effect because the output of the shift continuation allowance terminal 120 of m-th bit inhibits a start of shift of (m−1)th bit. The other function thereof is to make the shift operation conclusion output 119 of (p−1)th bit again "1" thereby to inhibit a shift operation subsequent to (p−1)th bit when the shift from (p−2)th bit to (p−1)th bit is concluded by the signal sent to the (p−1)th bit from the shift conclusion terminal 113. In this way the (p−2)th bit and bits subsequent thereto are shifted to bits to which they are to be shifted subsequently. Besides, the time required for a signal applied to the shift conclusion terminal 114 to be changed from "0" to "1" should be established longer than that required for the shift operation conclusion output 119 to be changed from "1" to "0". Furthermore, the time required for change of the latter should be short so that a shift may not be started from the former of former stage to the former stage.

According to the present invention, the state of a bit and those of adjacent bits are detected to control operations of those bits without using clocks, whereby a high speed shift operation is enabled with the full use of speed inherent to the circuitry. Furthermore, it is easily possible to make a signal indicating the position to be shifted, whereby an external control circuit is simplified and a data block of an arbitrary bit length can be shifted to an arbitrary position. Furthermore, data at a portion which is not to be shifted is held with no changes.

In the illustrated embodiment, the shift inhibition control terminal of m-th bit is made effective, but it is not necessarily established as effective unless the data from first bit to (m−1)th bit is to be held.

Furthermore, the constitution of each circuit is not limited to those of FIG. 4, and any construction for supplying signals required for the operation shown in FIG. 2 is available.

Furthermore, the embodiment of FIG. 4 shows a shift circuit conducting a uni-directional shift, but a shift circuit conducting a bi-directional shift operation can be used, and furthermore, it is possible to add a circuit for detecting conclusion of the shift operation.

Furthermore, the shift start control terminal and the shift inhibition control terminal are not necessarily provided at all the cells constituting a shift resister.

According to the present invention, a shift control section is provided at each bit cell, states of the particular bit and adjacent bits are detected without the use of clocks, and operations of those bits are controlled in accordance with the detection result, the shift inhibition control input, and the shift start control input. This construction makes it possible to conduct a high speed shift operation in accordance with the speed inherent to the circuitry with no losses. Furthermore, simplification of an external control circuitry is obtained.

What is claimed is:

1. A shift register which, including a plurality of cells each comprising a data latch section and a shift control section, operates without external clocks, wherein the shift control section comprises:

a terminal for receiving a shift start control signal;

a terminal for receiving a shift inhibition control signal;

a shift allowance control circuit which receives signals indicating as to whether each of the particular cell and the cells adjacent thereto is in a shift operation and signals indicating as to whether each of the adjacent cells is in a state which allows the shift of the particular cell, and generates a shift allowance signal to be given to the particular cell and the adjacent cells on the basis of the states of these cells and the shift inhibition control signal;

a shift control circuit which receives the shift start control signal, the output of the shift allowance control circuit, the state signals of the particular cell and the adjacent cell, and makes the data latch section to conduct a shift operation as well as outputs an in-shift-operation signal of the particular cell against the shift control circuit of the adjacent cell; and a shift conclusion control circuit which receives the shift inhibition control signal and the state signals of the particular cell and the adjacent cell, and outputs a signal for ordering to conclude the shift operation to the shift control circuit of the particular cell and a signal indicating the conclusion of shift operation to that of the adjacent cell.

2. A shift register as defined in claim 1, wherein the shift start control signal terminal and the shift inhibition control signal terminal are provided at desired cells.

3. A shift register as defined in claim 1, wherein the shift control section includes a circuit for controlling the shift direction.

* * * * *